United States Patent
Ahn

(10) Patent No.: US 8,049,477 B2
(45) Date of Patent: Nov. 1, 2011

(54) APPARATUS AND METHOD FOR BIAS MODULATOR USING ZERO CURRENT SWITCHING

(75) Inventor: Cheol-Woo Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 453 days.

(21) Appl. No.: 12/380,622

(22) Filed: Mar. 2, 2009

(65) Prior Publication Data
US 2009/0218995 A1 Sep. 3, 2009

(30) Foreign Application Priority Data
Mar. 3, 2008 (KR) .................. 10-2008-0019754

(51) Int. Cl.
*G05F 1/44* (2006.01)
*G05F 1/56* (2006.01)

(52) U.S. Cl. .................. 323/282; 323/284; 323/285

(58) Field of Classification Search .................. 323/282, 323/284, 285
See application file for complete search history.

(56) References Cited

U.S. PATENT DOCUMENTS

| | | | | |
|---|---|---|---|---|
| 4,415,959 A | * | 11/1983 | Vinciarelli | 363/21.04 |
| 5,490,057 A | * | 2/1996 | Vinciarelli et al. | 700/37 |
| 7,705,675 B2 | * | 4/2010 | McMorrow | 330/251 |
| 2008/0164914 A1 | * | 7/2008 | Bayadroun | 327/72 |

* cited by examiner

*Primary Examiner* — Bao Q Vu

(57) ABSTRACT

An apparatus and a method for a bias modulator using a Zero Current Switching (ZCS) are provided. The bias modulator includes a Pulse Width Modulation (PWM) signal generator for converting an input envelope signal to a PWM signal; a PWM/ZCS converter for calculating the number of ZCS control signals to be provided within an on-time duration of the PWM signal and generating at least one ZCS control signal according to the number of the ZCS control signals; and a ZCS switching regulator for generating a bias current according to the ZCS control signal.

14 Claims, 9 Drawing Sheets

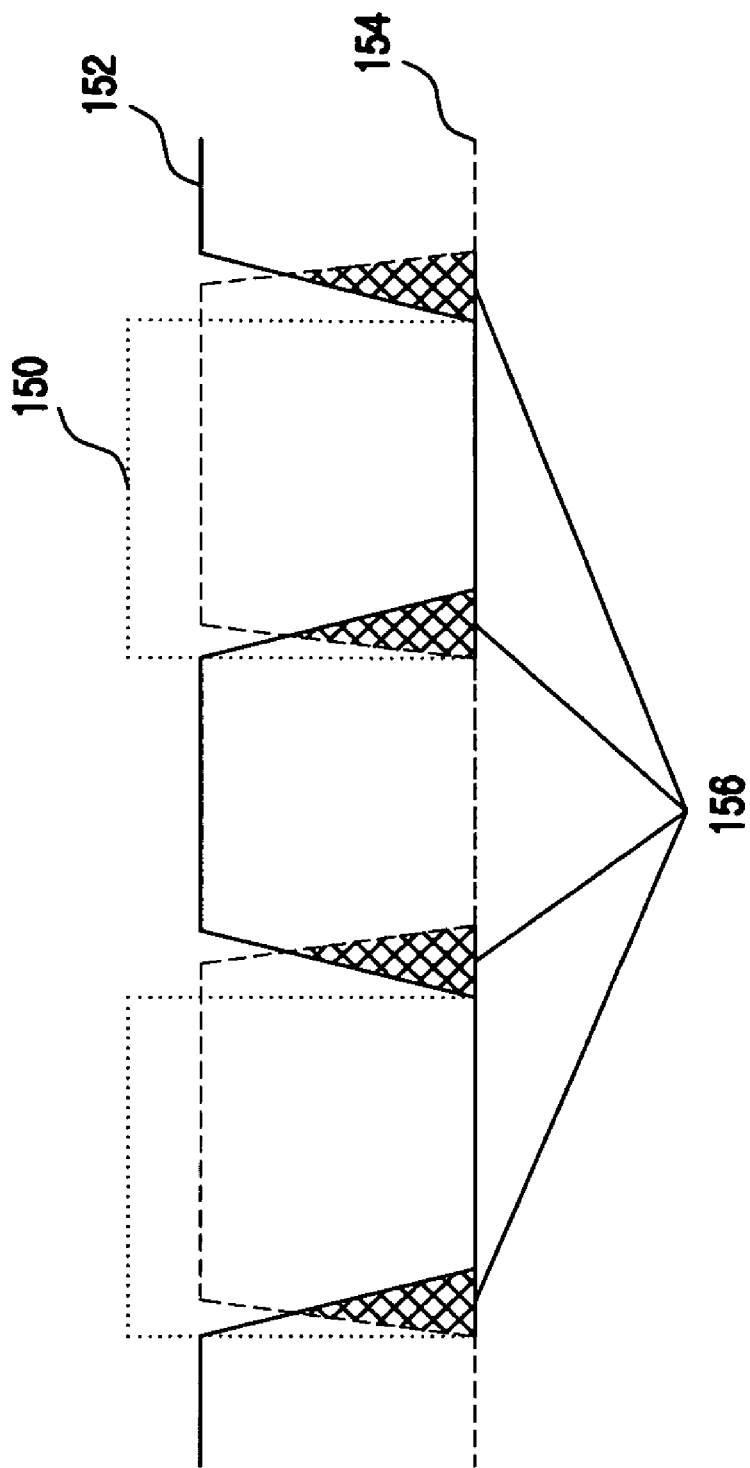

APPARATUS AND METHOD FOR BIAS MODULATOR USING ZERO CURRENT SWITCHING

CROSS-REFERENCE TO RELATED APPLICATION(S) AND CLAIM OF PRIORITY

The present application claims the benefit under 35 U.S.C. §119(a) to a Korean patent application filed in the Korean Intellectual Property Office on Mar. 3, 2008 and assigned Serial No. 10-2008-0019754, the entire disclosure of which is hereby incorporated by reference.

TECHNICAL FIELD OF THE INVENTION

The present invention relates generally to an apparatus and a method for a bias modulator using a Zero Current Switching (ZCS). More particularly, the present invention relates to an apparatus and a method for a bias modulator using a ZCS in a wireless communication system.

BACKGROUND OF THE INVENTION

Mass-capacity multimedia services and data gradually increase signal complexity and broaden a band in a wireless communication system. Correspondingly, a power amplifier which produces a final output in the system demands high efficiency and high linearity at the same time.

FIGS. 1A and 1B depict a conventional Radio Frequency (RF) power amplifier.

In FIG. 1A, I and Q signals generated at a baseband signal generator 100 are input to a baseband signal controller 102. The baseband signal controller 102 extracts an envelope of the signal. The envelope signal is supplied as power of a power amplifier 124 via a bias modulator 106. An RF modulator 104 modulates the baseband signal I+jQ received from the baseband signal controller 102 to an RF signal and outputs the RF signal to the power amplifier 124. The power amplifier 124 outputs a high-power RF signal by amplifying the RF signal.

The bias modulator 106 includes a linear amplifier 114 for supplying a linear current and a switching regulator 108 for supplying a high current. A control signal 150 of the switching regulator 108 is fed to a switch 118 via a Pulse Width Modulation (PWM) signal generator 110 that converts the envelope signal to a PWM signal and a switch driver 112 that regulates the signal magnitude to operate the switch.

The switching regulator 108 includes a power unit 116 for supplying the power, the switch 118 for switching on and off the power supply according to the control signal 150, an inductor 122 for removing a switching ripple of the current, and a diode 120 for building a current path when the switch is switched off.

In the bias modulator 106, the efficiency of the switching regulator 108 for supplying most of the currents is quite important. However, the switching regulator 108 is subject to a conduction loss caused when the current flows due to the resistance within the switch. That is the loss caused by the abnormal operation in the intrinsic loss of the component and the on/off state of the switch. That is a switching loss 156 superposed by the switching current 154 and the switch both-end voltage 152 as shown in FIG. 1B.

SUMMARY OF THE INVENTION

To address the above-discussed deficiencies of the prior art, it is a primary aspect of the present invention to address at least the above mentioned problems and/or disadvantages and to provide at least the advantages described below. Accordingly, an aspect of the present invention is to provide an apparatus and a method for a bias modulator using a Zero Current Switching (ZCS).

Another aspect of the present invention is to provide an apparatus and a method for compensating for a switch off time by feeding back a switch current at a bias modulator using a ZCS.

Yet another aspect of the present invention is to provide an apparatus and a method for controlling a ZCS signal by calculating a ZCS timing based on an voltage of an output signal in a bias modulator using a ZCS.

According to one aspect of the present invention, an apparatus for a bias modulator using a ZCS includes a Pulse Width Modulation (PWM) signal generator for converting an input envelope signal to a PWM signal; a PWM/ZCS converter for calculating the number of ZCS control signals to be provided within an on-time duration of the PWM signal and generating at least one ZCS control signal according to the number of the ZCS control signals; and a ZCS switching regulator for generating a bias current according to the ZCS control signal.

According to another aspect of the present invention, a method for operating a bias modulator using a ZCS includes converting an input envelope signal to a PWM signal; calculating the number of ZCS control signals to be provided within an on-time duration of the PWM signal; generating at least one ZCS control signal according to the number of the ZCS control signals; and generating a bias current by operating a ZCS switching regulator according to the ZCS control signal.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 1A and 1B illustrate a conventional Radio Frequency (RF) power amplifier;

Throughout the drawings, like reference numerals will be understood to refer to like parts, components and structures.

DETAILED DESCRIPTION OF THE INVENTION

FIGS. 2 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Exemplary embodiments of the present invention provide an apparatus and a method for controlling a switching using a Zero Current Switching (ZCS) at a bias modulator.

The ZCS has a structure of a general switching regulator as a whole. With a resonant block including an inductor and a capacity added, a switching loss can be reduced by blocking the current flowing a switch before the switch is switched off.

Figure 1A:
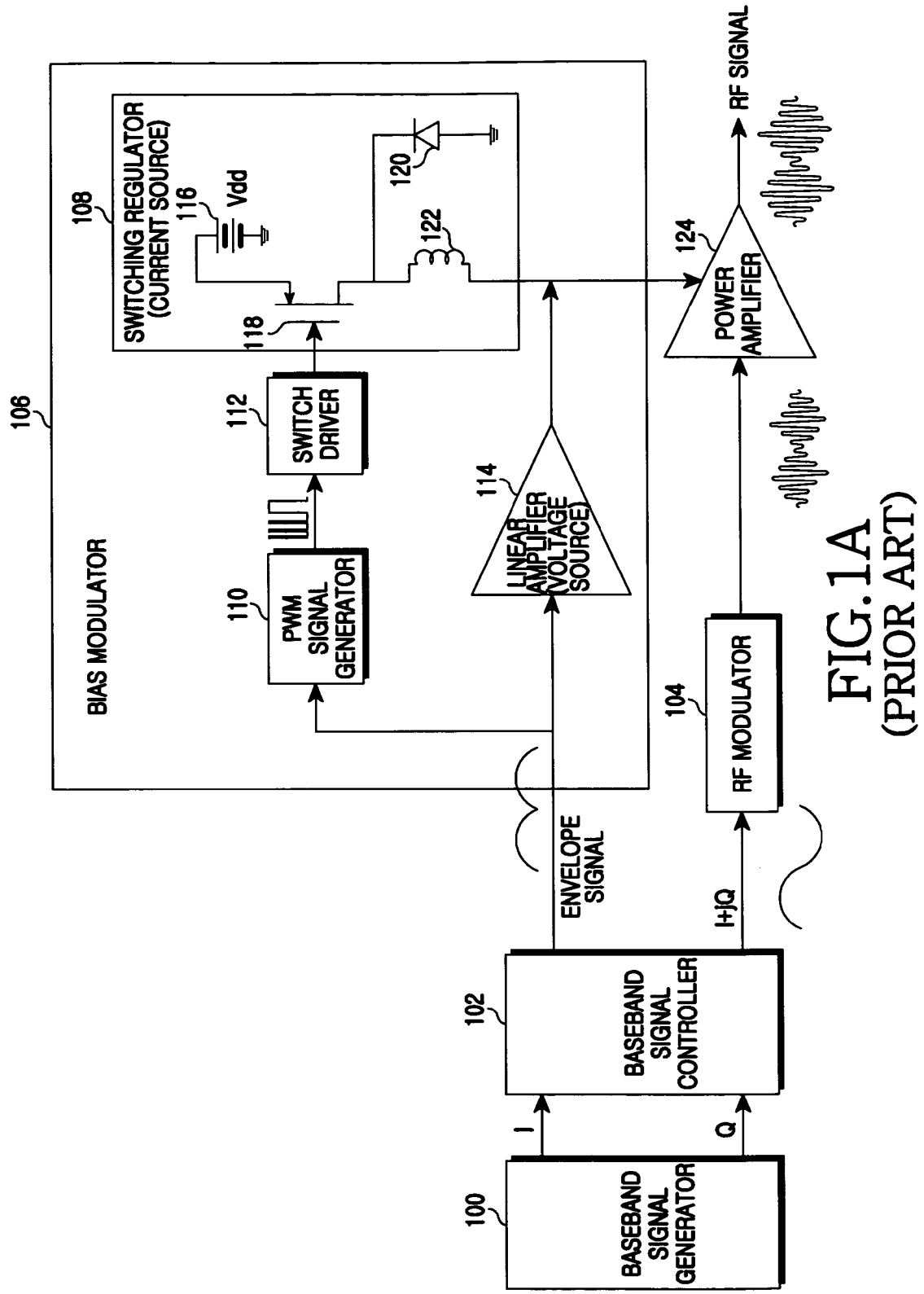
Figure 2:
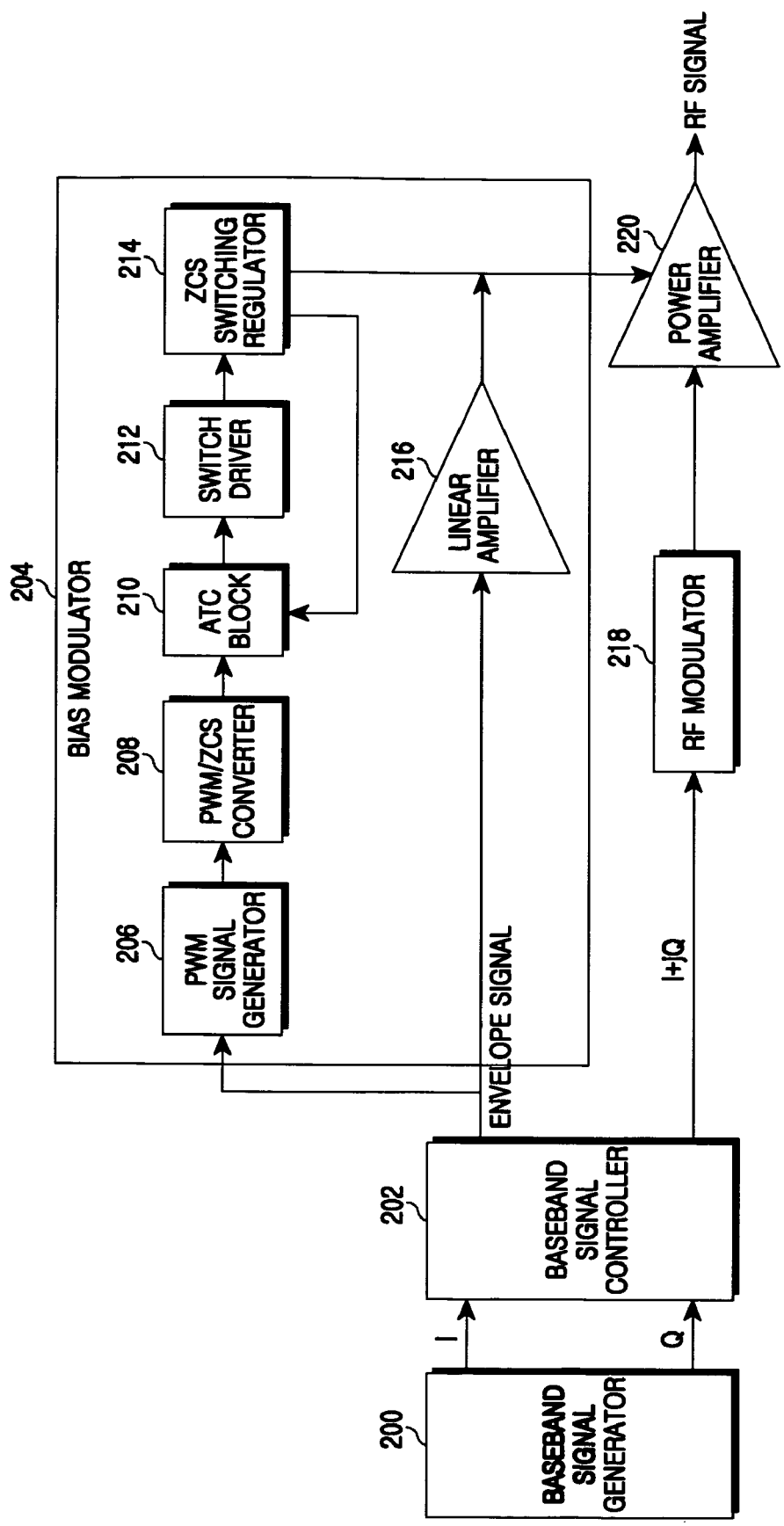
FIG. 2 illustrates a power amplifier for compensating for a switch off time by feeding back a switch current in a bias modulator using a Zero Current Switching (ZCS) according to an exemplary embodiment of the present invention.

FIG. 2 is a block diagram of a power amplifier for compensating for a switch off time by feeding back a switch current in a bias modulator using a ZCS according to an exemplary embodiment of the present invention.

The power amplifier of FIG. 2 includes a baseband signal generator 200, a baseband signal controller 202, a bias modulator 204, a Radio Frequency (RF) modulator 218, and a power amplifier 220.

I and Q signals, generated at the baseband signal generator 200, are fed to the baseband signal controller 202. The baseband signal controller 202 extracts an envelope of the I and Q signals. The bias modulator 204 supplies power for the power amplifier 220 using the envelope signal. The RF modulator 218 modulates the baseband signal, I+jQ, received from the baseband signal controller 202 to an RF signal. The power amplifier 220 outputs a high-power RF signal by amplifying the RF signal.

The bias modulator 204 includes a Pulse Width Modulator (PWM) signal generator 206, a PWM/ZCS converter 208, an Adaptive Timing Control (ATC) block 210, a switch driver 212, a ZCS switching regulator 214, and a linear amplifier 216.

The PWM signal generator 206 generates a PWM signal by low-pass filtering the envelope signal provided from the baseband signal controller 202 and outputs the PWM signal to the PWM/ZCS converter 208.

The PWM/ZCS converter 208 calculates an on-time duration of the PWM signal and the number of ZCS control signals to be fed within the on-time duration, and issues the ZCS control signals in accordance with its internal clock based on the number of the ZCS control signals.

The ATC block 210 outputs the control signal by regulating a timing not to turn off the switch when the current is present through a logic OR operation with a feedback signal fed from the ZCS switching regulator 214.

The switch driver 212 regulates the magnitude of the signal output from the ATC block 210 to operate the switch of the ZCS switching regulator 214 and outputs the regulated signal to the ZCS switching regulator 214.

The ZCS switching regulator 214 prevents the flow of the backward current, feeds back the switch on/off to the ATC block 210, and supplies the bias current of the power amplifier 220. When the PWM signal is lengthened, the ZCS switching regulator 214 switches on and then keeps switching on the current automatically switched off by a resonant block of the ZCS switch regulator 214 according to a ZCS time cycle.

Figure 3:
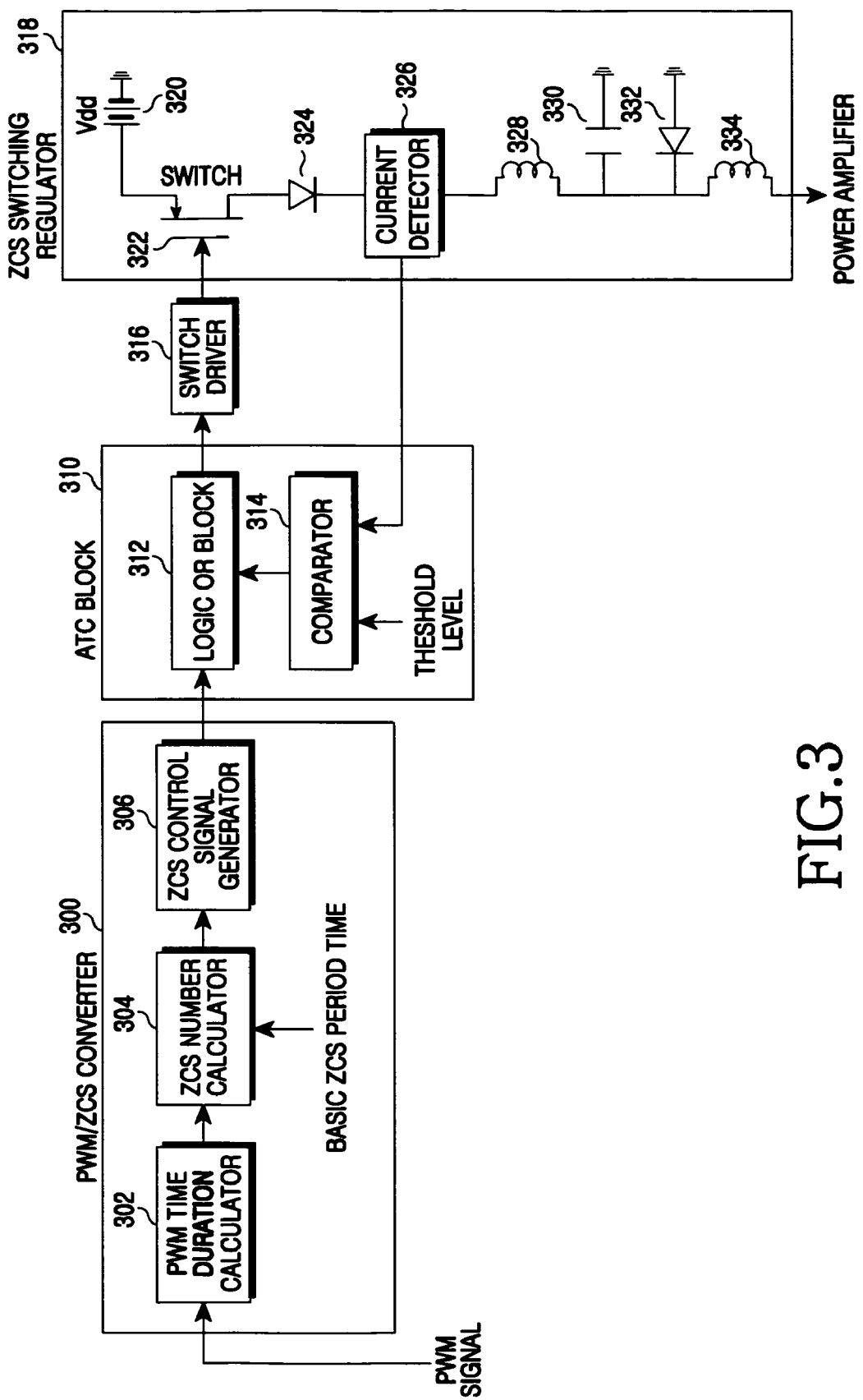
FIG. 3 illustrates the bias modulator for compensating for the switch off time by feeding back the switch current according to an exemplary embodiment of the present invention.

FIG. 3 is a block diagram of the bias modulator 204 for compensating for the switch off time by feeding back the switch current according to an exemplary embodiment of the present invention.

Referring to FIG. 3, the bias modulator 204 includes a PWM/ZCS converter 300, an ATC block 310, a switch driver 316, and a ZCS switching regulator 318. The PWM/ZCS converter 300 includes a PWM time duration calculator 302, a ZCS number calculator 304, and a ZCS control signal generator 306. The ATC block 310 includes a logic OR block 312 and a comparator 314. The ZCS switching regulator 318 includes a power unit 320, a switch 322, diode 324, a current detector 326, an inductor 328, a capacitor 330, a diode 332, and an inductor 334.

The PWM time duration calculator 302 of the PWM/ZCS converter 300 calculates and outputs the on-time duration of the PWM signal to the ZCS number calculator 304. The ZCS number calculator 304 calculates the number of the ZCS control signals to be fed within the on-time duration and applies the number of the ZCS control signals to the ZCS control signal generator 306. Herein, the number of the ZCS control signals N_zcs to be fed within the on-time duration is defined as Rounddown[Pulse On Time/Basic ZCS Period Time], where Rounddown[ ] denotes the rounding down, Pulse On Time denotes the on-time duration, and Basic ZCS Period Time denotes a basic ZCS control signal period. The basic ZCS control signal period is determined by the inductor and the capacitor of the resonant block of the ZCS in the design phase of the ZCS switching regulator 318 when the average current flows. N_zcs is an integer that is rounded down from the calculation result. The ZCS control signal generator 306 generates ZCS signals matching the basic ZCS control signal period as many as the ZCS control signals calculated by the ZCS number calculator 304 and outputs the generated ZCS signals to the ATC block 310. That is, the ZCS control signal generator 306 issues the ZCS control signals as many as the ZCS control signals having the basic ZCS control signal period length.

When a value of current on the switch 322 fed from the current detector 326 of the ZCS switching regulator 318 is less than a threshold level, the comparator 314 of the ATC block 310 outputs '0' to the logic OR block 312. When the value of current on the switch 322 is greater than the threshold level, the comparator 314 outputs '1' to the logic OR block 312. Herein, it is advantageous that the threshold level is determined through experiments to define the on/off state of the switch 322. The logic OR block 312 controls the timing not to switch off while the current is flowing by performing the logic OR operation on the ZCS signals output from the ZCS control signal generator 306 and the output of the comparator 314. Hence, when the current detector 326 detects the current or when the PWM/ZCS converter 300 provides the ZCS signals, the ATC block 310 is not switched off.

The switch driver 316 regulates the magnitude of the signal output from the ATC block 310 to operate the switch of the ZCS switching regulator 318 and outputs the regulated signal to the ZCS switching regulator 318.

The current detector 326 of the ZCS switching regulator 318 detects the current flowing through the switch 322 and outputs the detected current to the comparator 314 of the ATC block 310. That is, the current detector 326 feeds back the on/off of the current fed to the switch 322. The diode 324 of the ZCS switching regulator 318 prevents the flow of the backward current. The switch 322 receives the power from the power unit 320 and switches on/off according to the control signal from the switch driver 316. The inductor 328 and the capacitor 330, which constitute the resonant block of the ZCS switching regulator 318, operate to block the current flowing through the switch 322 before the switch 322 is switched off, thus preventing the switching loss when the switch 322 is off. The diode 332 establishes the current path when the switch 322 is in the off state. The inductor 334 prevents the switching ripple of the current.

Figure 4:
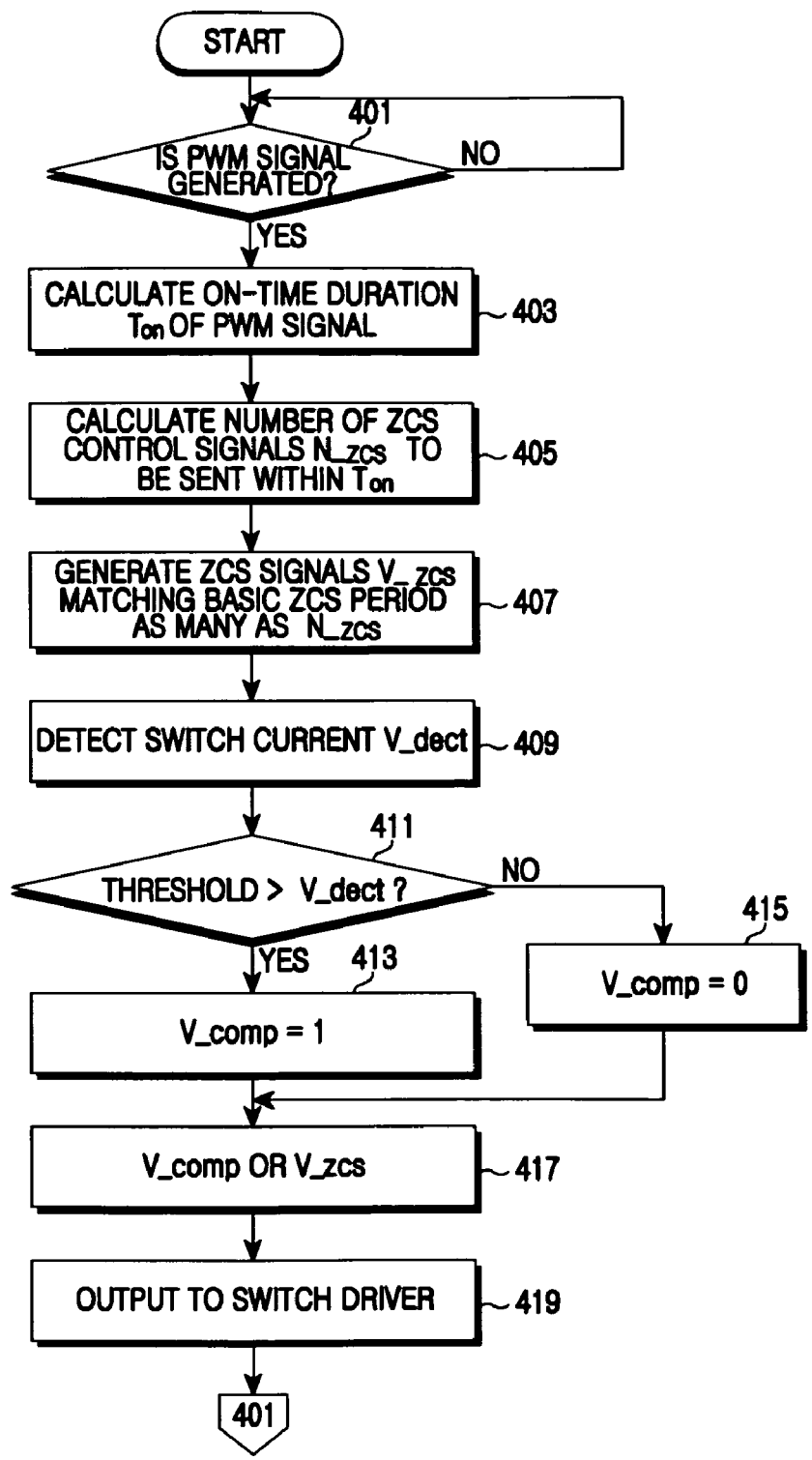
FIG. 4 illustrates a method for compensating for the switch off time by feeding back the switch current in the bias modulator using the ZCS according to an exemplary embodiment of the present invention.

FIG. 4 is a flowchart outlining a method for compensating for the switch off time by feeding back the switch current in the bias modulator using the ZCS according to an exemplary embodiment of the present invention.

In step 401, the bias modulator checks whether the PWM signal is generated or not. Upon detecting the PWM signal, the bias modulator calculates the on-time duration $T_{on}$ of the PWM signal in step 403.

In step 405, the bias modulator calculates the number of the ZCS control signals N_zcs to be fed within the on-time duration $T_{on}$. Herein, the number of the ZCS control signals N_zcs to be fed within the on-time duration $T_{on}$ is defined as Rounddown[Basic ZCS Period Time/Basic ZCS Period Time], where Rounddown[ ] denotes the rounding down, Pulse On Time denotes the on-time duration $T_{on}$, and Basic ZCS Period Time denotes the basic ZCS control signal period.

In step 407, the bias modulator generates ZCS control signals V_zcs matching the basic ZCS control signal period as many as N_zcs. In other words, the bias modulator issues N_zcs-ary ZCS control signals V_zcs that are the basic ZCS control signal period in length. Next, the bias modulator detects the switch current V_dect in step 409.

In step 411, the bias modulator checks whether the detected switch current V_dect is less than a threshold level. When the detected switch current V_dect is greater than the threshold level, the bias modulator inputs '1' to V_comp in step 413. When the switch current V_dect is less than or equal to the threshold level, the bias modulator inputs '0' to V_comp in step 413. Herein, V_comp is a variable for indicating the on/off state of the switch and is determined by comparing the detected current V_dect with the threshold level. The threshold level can be determined through experiments to define the on/off state of the switch current.

In step 417, the bias modulator performs N_zcs times logic OR operations on ZCS control signals V_zcs according to the basic ZCS period and V_comp. In step 419, the bias modulator outputs the logic OR operation result to the switch driver. Next, the bias modulator returns to step 401.

Figure 5:
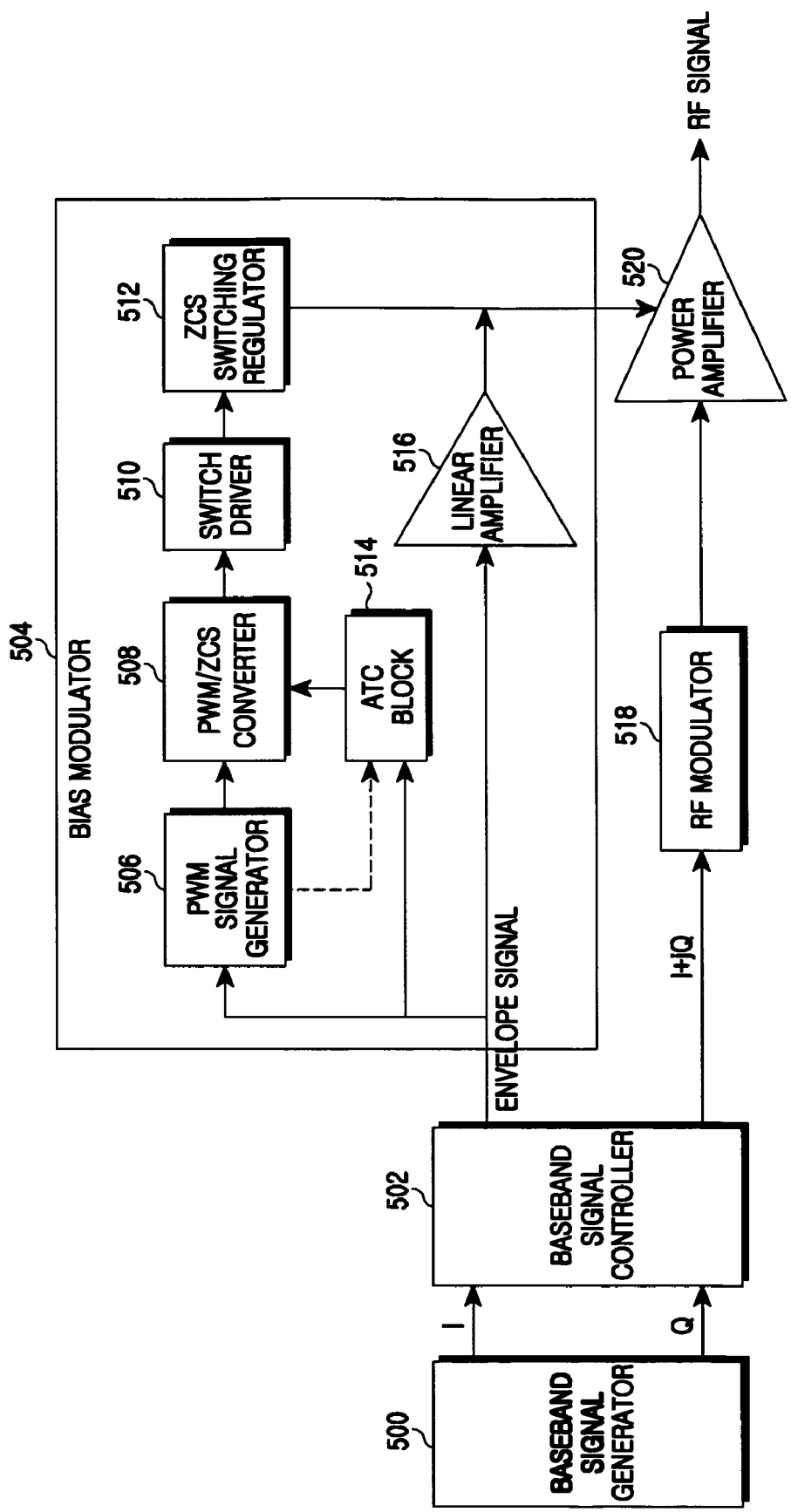
FIG. 5 illustrates a power amplifier for controlling a ZCS control signal by calculating a ZCS timing based on a voltage of an output signal in a bias modulator using the ZCS according to another exemplary embodiment of the present invention.

FIG. 5 is a block diagram of a power amplifier for controlling a ZCS control signal by calculating a ZCS timing based on a voltage of an output signal in a bias modulator using the ZCS according to another exemplary embodiment of the present invention.

The power amplifier of FIG. 5 includes a baseband signal generator 500, a baseband signal controller 502, a bias modulator 504, an RF modulator 518, and a power amplifier 520.

I and Q signals generated at the baseband signal generator 500 are fed to the baseband signal controller 502. The baseband signal controller 502 extracts an envelope of the I and Q signals. The bias modulator 504 supplies power to the power amplifier 520 using the envelope signal. The RF modulator 518 modulates the baseband signal I+jQ received from the baseband signal controller 502 to an RF signal. The power amplifier 520 outputs a high-power RF signal by amplifying the RF signal.

The bias modulator 504 includes a PWM signal generator 506, a PWM/ZCS converter 508, a switch driver 510, a ZCS switching regulator 512, an ATC block 514, and a linear amplifier 516.

The PWM signal generator 506 generates a PWM signal by low-pass filtering the envelope signal provided from the baseband signal controller 502 and outputs the PWM signal to the PWM/ZCS converter 508.

The PWM/ZCS converter 508 calculates an on-time duration of the PWM signal and the number of ZCS control signals to be fed within the on-time duration, and issues the ZCS control signals in accordance with its internal clock according to the number of the ZCS control signals. The ZCS control signals are added with the output of the ATC block 514 and applied to the switch driver 510.

The ATC block 514 calculates the output voltage by extracting the envelope signal from the baseband signal controller 502, calculates the timing of the ZCS control signal according to the output voltage, and outputs the calculated timing to the PWM/ZCS converter 508.

The switch driver 510 regulates the magnitude of the signal output from the PWM/ZCS converter 508 to operate the switch of the ZCS switching regulator 512 and outputs the regulated signal to the ZCS switching regulator 512.

The ZCS switching regulator 512 supplies the bias current of the power amplifier 520. When the PWM signal is lengthened, the ZCS switching regulator 512 switches on and then keeps switching on the current automatically switched off by a resonant block of the ZCS switch regulator 512 according to a ZCS time cycle.

Figure 6:
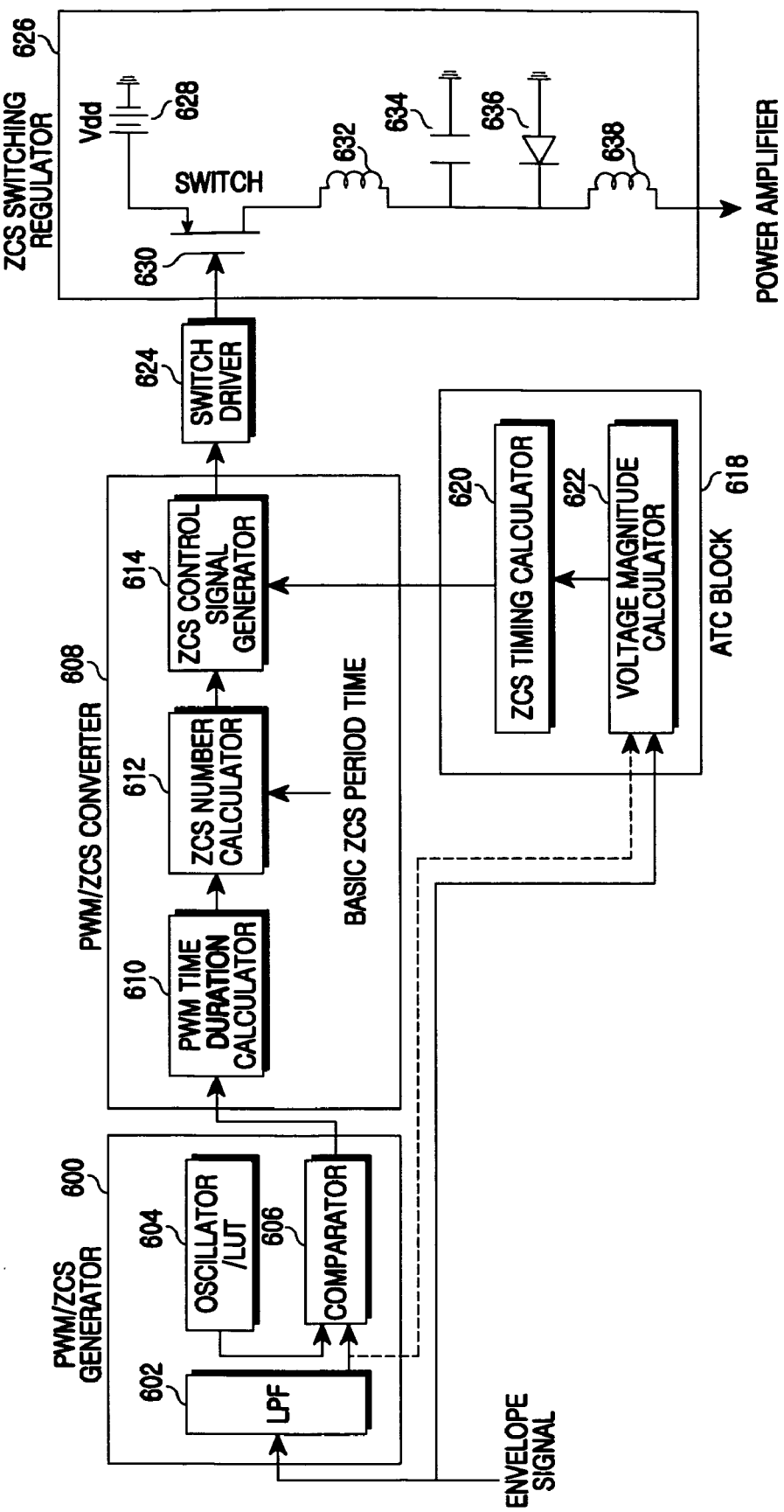
FIG. 6 illustrates a bias modulator for controlling the ZCS signal by calculating the ZCS timing based on the voltage of the output signal according to another exemplary embodiment of the present invention.

FIG. 6 is a block diagram of the bias modulator 504 for controlling the ZCS signal by calculating the ZCS timing based on the voltage of the output signal according to another exemplary embodiment of the present invention.

Referring to FIG. 6, the bias modulator 504 includes a PWM/ZCS signal generator 600, a PWM/ZCS converter 608, an ATC block 618, a switch driver 624, and a ZCS switching regulator 626. The PWM/ZCS signal generator 600 includes a Low Pass Filter (LPF) 602, an oscillator/LookUp Table (LUT) 604, and a comparator 606. The PWM/ZCS converter 608 includes a PWM time duration calculator 610, a ZCS number calculator 612, and a ZCS control signal generator 614. The ATC block 618 includes a ZCS timing calculator 620 and a voltage magnitude calculator 622. The ZCS switching regulator 626 includes a power unit 628, a switch 630, an inductor 632, a capacitor 634, a diode 636, and an inductor 638.

The LPF 602 of the PWM/ZCS signal generator 600 low-pass filters the envelope signal output from the baseband signal controller 502. The comparator 606 outputs the PWM signal to the PWM/ZCS converter 608 by referring to a triangular wave oscillator or an LUT provided from the oscillator/LUT 604.

The PWM time duration calculator 610 of the PWM/ZCS converter 608 calculates and outputs the on-time duration of the input PWM signal to the ZCS number calculator 612. The ZCS number calculator 612 calculates the number of the ZCS control signals to be fed within the on-time duration and applies the number of the ZCS control signals to the ZCS control signal generator 614. Herein, the number of the ZCS control signals to be fed in the on-time duration is defined as Rounddown[Pulse On Time/Basic ZCS Period Time], where Rounddown[ ] denotes the rounding down, Pulse On Time denotes the on-time duration, and Basic ZCS Period Time denotes a basic ZCS control signal period. The basic ZCS control signal period is determined by the inductor and the capacitor of the resonant block of the ZCS in the design phase of the ZCS switching regulator 626 when the average current flows. N_zcs is an integer that is rounded down from the calculation result. The ZCS control signal generator 614 generates as many ZCS control signals as the input ZCS control signals and outputs the generated one or more ZCS control signals to the switch driver 624. In so doing, the ZCS control signal generator 614 increases the basic ZCS period by the timing value provided from the ACT block 618 and, thus, issues the timing-regulated ZCS control signals. That is, the ZCS control signal generator 614 issues the ZCS control signals as many as the ZCS control signals having the increased basic ZCS period in length.

The voltage magnitude calculator 622 of the ATC block 618 calculates the voltage magnitude of the envelope signal extracted by the baseband signal controller 502 or the signal filtered by the LPF 602 of the PWM signal generator 600 and outputs the calculated voltage magnitude to the ZCS timing calculator 620 of the ATC block 618. The ZCS timing calculator 620 determines the timing value of the ZCS control signal corresponding to the voltage magnitude by referring to its pre-stored LUT, or through computations, and outputs the determined timing value to the ZCS control signal generator 614 of the PWM/ZCS converter 608.

The switch driver 624 regulates the magnitude of the input signal to operate the switch 630 of the ZCS switching regulator 626 and outputs the regulated signal to the ZCS switching regulator 626.

The switch 630 of the ZCS switching regulator 626 receives the power from the power unit 628 and switches on and off the control signal fed from the switch driver 624. The inductor 632 and the capacitor 634, which are the resonant block of the ZCS switching regulator 626, operate to block the current flowing through the switch 630 before the switch 630 is switched off, thus preventing the switching loss in the off state of the switch 630. The diode 636 builds a current path when the switch 630 is switched off. The inductor 637 prevents the switching ripple of the current.

Figure 7:
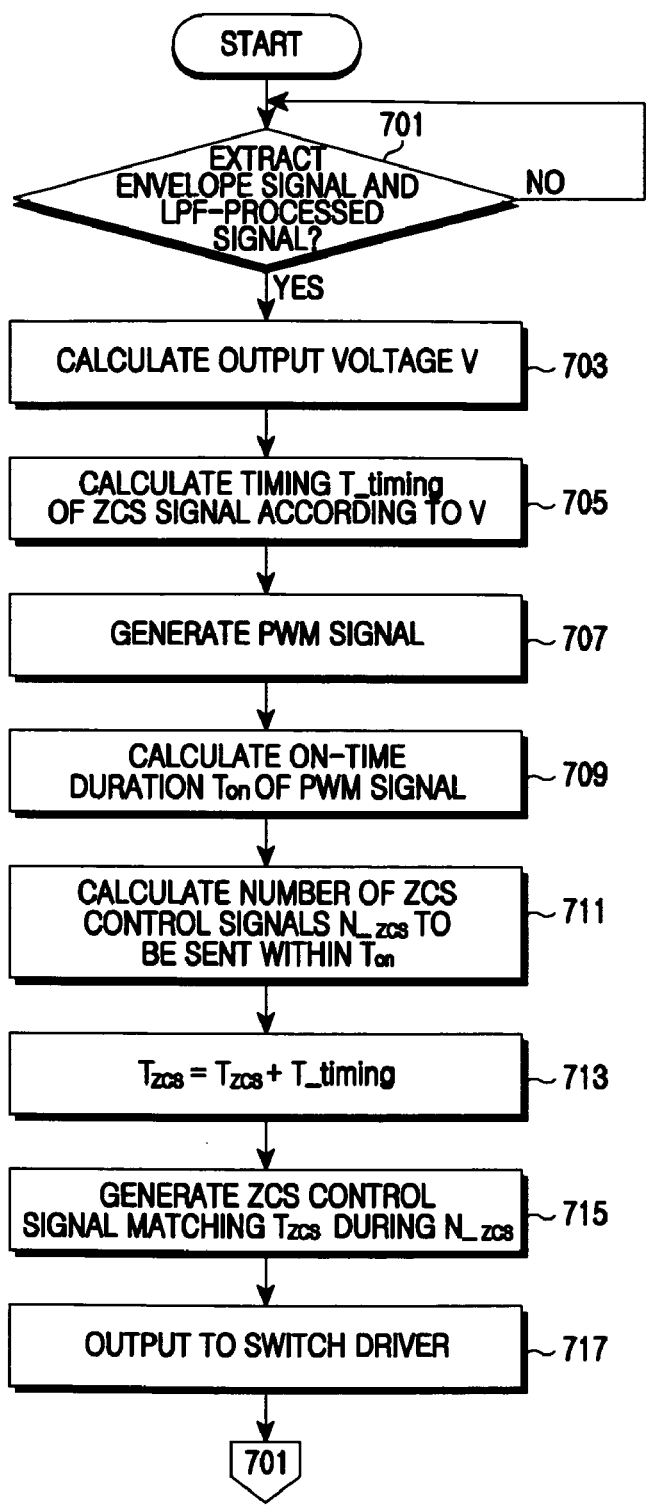
FIG. 7 illustrates a method for controlling the ZCS signal by calculating the ZCS timing based on the voltage of the output signal in the bias modulator using the ZCS according to another exemplary embodiment of the present invention.

FIG. 7 is a flowchart outlining a method for controlling the ZCS signal by calculating the ZCS timing based on the voltage of the output signal in the bias modulator using the ZCS according to another exemplary embodiment of the present invention.

In step 701, the bias modulator checks whether the envelope signal and the signal generated by the PWM signal generator and low-pass filtered are extracted or not. When the low-pass filtered signal is extracted, the bias modulator calculates the output voltage V of the extracted signal in step 703.

In step 705, the bias modulator calculates the timing T_timing of the ZCS control signal according to the output voltage V. Herein, the timing T_timing of the ZCS control signal is calculated using the experiments or the LUT storing the pre-calculated result. Next, the bias modulator generates the PWM signal in step 707 and calculates the on-time duration $T_{on}$ of the PWM signal in step 709.

In step 711, the bias modulator calculates the number N_zcs of the ZCS control signals to be fed within the on-time duration $T_{on}$. Herein, the number N_zcs of the ZCS control signals provided within the on-time duration $T_{on}$ is defined as N_zcs=Rounddown[$T_{on}/T_{zcs}$], where Rounddown[ ] denotes the rounding down, Pulse On Time denotes the on-time duration $T_{on}$, and Basic ZCS Period Time denotes the basic ZCS control signal period.

In step 713, the bias modulator adds the basic signal, ZCS control signal, period value, and the timing value T_timing of the ZCS signal according to the output voltage V, as calculated in step 705. Namely, the bias modulator increases the basic ZCS control signal period by the timing value T_timing.

In step 715, the bias modulator generates ZCS control signals matching the basic ZCS control signal period $T_{zcs}$ during N_zcs. That is, the bias modulator issues N_zcs-ary ZCS control signals being the basic ZCS control signal period $T_{zcs}$ in length.

Next, the bias modulator outputs the ZCS control signals to the switch driver in step 717 and goes back to step 701.

As stated above, the step for calculating the timing of the ZCS control signal according to the output voltage by calculating the output voltage and the step for calculating the number of the ZCS control signals to be applied within the on-time duration by calculating the on-time duration of the PWM signal are conducted in sequence or at the same time.

Figure 8:
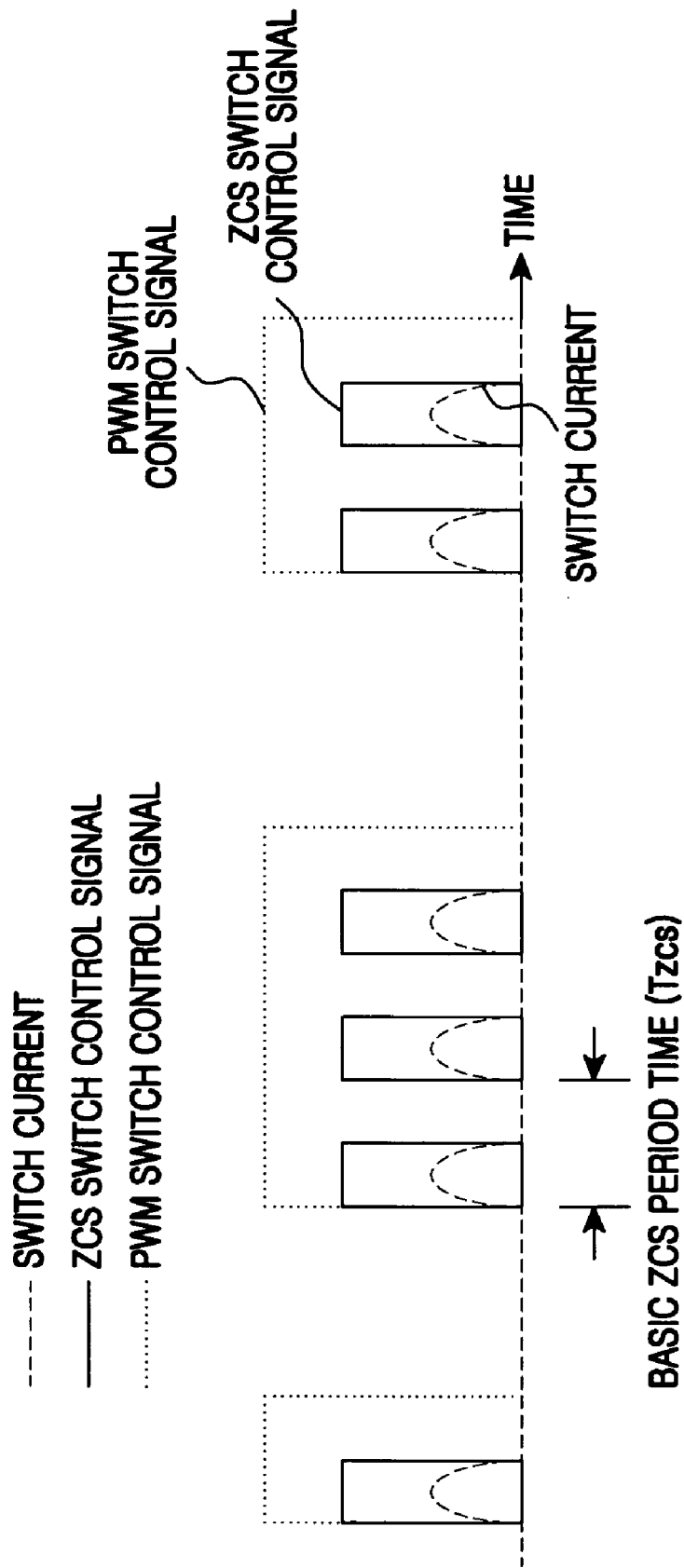
FIG. 8 illustrates a ZCS control signal timing according to an exemplary embodiment of the present invention.

FIG. 8 is a graph showing the ZCS control signal timing according to an exemplary embodiment of the present invention.

In FIG. 8, the number of the ZCS control signals is determined by the on-time duration of the PWM signal. Using either method aforementioned; that is, the method for compensating for the switch off time by feeding back the switch current or the method for compensating for the ZCS control signals by calculating the ZCS timing based on the voltage of the output signal, the ZCS switch control signal is generated without loss.

In the light of the foregoing, the bias modulator controls the switching using the ZCS. Therefore, the bias modulator of low loss and high efficiency can be accomplished, compared to the general switching-based regulator.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for a bias modulator using a Zero Current Switching (ZCS), the apparatus comprising:
  a Pulse Width Modulation (PWM) signal generator for converting an input envelope signal to a PWM signal;
  a PWM/ZCS converter for determining the number of ZCS control signals to be provided within an on-time duration of the PWM signal and generating at least one ZCS control signal according to the number of the ZCS control signals; and a ZCS switching regulator for generating a bias current according to the at least one ZCS control signal.

2. The apparatus of claim 1, wherein the bias modulator conforms to one of an Envelope Elimination and Restoration (EER) and an Envelope Tracking (ET).

3. The apparatus of claim 1, wherein the number of the ZCS control signals is acquired by dividing the on-time duration of the PWM signal by a basic ZCS period.

4. The apparatus of claim 3, wherein the basic ZCS period is determined by an inductor and a capacitor of a resonant block of the ZCS switching regulator when an average current flows.

5. The apparatus of claim 1, wherein the ZCS switching regulator comprises:
 a current detector for detecting a current on a switch within the ZCS switching regulator.

6. The apparatus of claim 5, further comprising:
 an Adaptive Timing Control (ATC) block for regulating a timing of the ZCS control signal not to switch off when the current on the switch is greater than a threshold level.

7. The apparatus of claim 1, further comprising:
 an ATC block for determining a timing of the ZCS control signal according to an output voltage of the envelope signal,
 wherein the PWM/ZCS converter regulates the timing of the ZCS control signal by adding the timing to the basic ZCS period.

8. A method for operating a bias modulator using a Zero Current Switching (ZCS), the method comprising:
 converting an input envelope signal to a Pulse Width Modulation (PWM) signal;
 determining the number of ZCS control signals to be provided within an on-time duration of the PWM signal;
 generating at least one ZCS control signal according to the number of the ZCS control signals; and
 generating a bias current by operating a ZCS switching regulator according to the at least one ZCS control signal.

9. The method of claim 8, wherein the bias modulator conforms to one of an Envelope Elimination and Restoration (EER) and an Envelope Tracking (ET).

10. The method of claim 8, wherein the number of the ZCS control signals is acquired by dividing the on-time duration of the PWM signal by a basic ZCS period.

11. The method of claim 10, wherein the basic ZCS period is determined by an inductor and a capacitor of a resonant block of the ZCS switching regulator when an average current flows.

12. The method of claim 8, further comprising:
 detecting a current on a switch within the ZCS switching regulator.

13. The method of claim 12, further comprising:
 regulating a timing of the ZCS control signal not to switch off when the current on the switch is greater than a threshold level.

14. The method of claim 8, further comprising:
 determining a timing of the ZCS control signal according to an output voltage of the envelope signal; and
 regulating the timing of the ZCS control signal by adding the timing to the basic ZCS period.

* * * * *